US009818712B2

(12) United States Patent
Holm et al.

(10) Patent No.: US 9,818,712 B2
(45) Date of Patent: Nov. 14, 2017

(54) PACKAGE WITH LOW STRESS REGION FOR AN ELECTRONIC COMPONENT

(71) Applicant: FREESCALE SEMICONDUCTOR, INC., Austin, TX (US)

(72) Inventors: Paige M. Holm, Phoenix, AZ (US); Vijay Sarihan, Paradise Valley, AZ (US)

(73) Assignee: NXP USA, Inc., Austin, TX (US)

( * ) Notice: Subject to any disclaimer, the term of this patent is extended or adjusted under 35 U.S.C. 154(b) by 97 days.

(21) Appl. No.: 14/596,888

(22) Filed: Jan. 14, 2015

(65) Prior Publication Data

US 2016/0204089 A1 Jul. 14, 2016

(51) Int. Cl.
*H01L 23/02* (2006.01)
*H01L 23/00* (2006.01)

(52) U.S. Cl.
CPC .............. *H01L 24/17* (2013.01); *H01L 24/05* (2013.01); *H01L 24/11* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/0401* (2013.01); *H01L 2224/05569* (2013.01); *H01L 2224/05624* (2013.01); *H01L 2224/05644* (2013.01); *H01L 2224/05647* (2013.01); *H01L 2224/06134* (2013.01); *H01L 2224/1134* (2013.01); *H01L 2224/11462* (2013.01); *H01L 2224/11849* (2013.01); *H01L 2224/131* (2013.01); *H01L 2224/1319* (2013.01); *H01L 2224/13111* (2013.01); *H01L 2224/13144* (2013.01); *H01L 2224/13155* (2013.01); *H01L 2224/14179* (2013.01); *H01L 2224/16227* (2013.01); *H01L 2224/32225* (2013.01); *H01L 2224/73204* (2013.01);
(Continued)

(58) Field of Classification Search
CPC ...................................................... H01L 25/16
USPC ........................................................... 257/421
See application file for complete search history.

(56) References Cited

U.S. PATENT DOCUMENTS 7,030,469 B2 * 4/2006 Mahadevan .......... H01L 21/561
257/659
8,350,382 B2 * 1/2013 Furgut ................ H01L 23/3121
257/723

(Continued)

OTHER PUBLICATIONS

Fraux, ("Asahi Kasei Microsystems AK 8973S Triple-Axis Electronic Compass") 2010 by System Plus Consulting pp. 1-14.*
(Continued)

*Primary Examiner* — Telly Green
(74) *Attorney, Agent, or Firm* — Charlene R. Jacobsen

(57) ABSTRACT

A device package includes a substrate having an active surface. Electrical connection bumps are deposited on the active surface and are arranged in an array having a perimeter. At least one electronic component is formed at a region of the active surface, where the region is located outside of the perimeter of the array of electrical connection bumps. When the device package is coupled with external circuitry via the electrical connection bumps, the region at which the electronic component is formed is suspended over the electronic circuitry. This region is subject to a lower stress profile than a region of the active surface circumscribed by the perimeter. Thus, stress sensitive electronic components can be located in this lower stress region of the active surface.

15 Claims, 5 Drawing Sheets

(52) U.S. Cl.
CPC ............... *H01L 2224/81191* (2013.01); *H01L 2224/81203* (2013.01); *H01L 2224/81815* (2013.01); *H01L 2224/92125* (2013.01); *H01L 2224/94* (2013.01); *H01L 2924/14* (2013.01); *H01L 2924/146* (2013.01)

(56) References Cited

U.S. PATENT DOCUMENTS

| | | | | |
|---|---|---|---|---|
| 2005/0046041 | A1* | 3/2005 | Tsai | H01L 25/16 257/778 |
| 2005/0189627 | A1* | 9/2005 | Ito | H01L 21/4825 257/666 |
| 2008/0135959 | A1 | 6/2008 | Theuss et al. | |
| 2008/0164335 | A1* | 7/2008 | Quinones | B05B 15/04 239/7 |
| 2009/0079065 | A1* | 3/2009 | Furgut | H01L 23/3121 257/724 |
| 2014/0061888 | A1* | 3/2014 | Lin | H01L 23/3128 257/690 |
| 2015/0282341 | A1* | 10/2015 | Hu | H05K 1/115 361/750 |

OTHER PUBLICATIONS

Bosch, "Two very different approaches to MEMS packaging", 3D Packaging, Feb. 2013, pp. 6-7, Issue No. 26.

Asahi Kasei Microdevices Corporation (AKM), Short Datasheet, 3-axis Electronic Compass, 2014, pp. 1-18.

Bosch Sensortec, BMC150 eCompass (6-axis digital compass), BOSCH Invented for life, pp. 1-2, Doc. No. BST-BMC150-FL000-00 / Version_1.0_092012.

Fraux, "Reverse Costing analysis", Asahi Kasei Microsystems AK8973S Triple-Axis Electronic Compass, Sep. 2010, pp. 1-14, Version 1, System Plus Consulting.

* cited by examiner

PACKAGE WITH LOW STRESS REGION FOR AN ELECTRONIC COMPONENT

TECHNICAL FIELD OF THE INVENTION

The present invention relates generally to device packages. More specifically, the present invention relates to packaging stress sensitive electronic components in low stress regions of a wafer level chip scale package (WLCSP).

BACKGROUND OF THE INVENTION

Integrated circuit dies, also referred to as chips, are often encapsulated in a plastic molded package to protect the sensitive electronic components, e.g., integrated circuits, sensors, and so forth, from environmental effects and contaminants, such as moisture, physical shock, and the like. Unfortunately, electronic component dies encapsulated within a plastic molded package can be subject to both internal and external stresses exerted on an electronic component die that can adversely affect the performance of the electronic components.

Internal stresses may be caused by the die's interaction with the plastic molding material of the package itself. That is, both changes in temperature and humidity can cause the plastic to expand or contract, thereby imparting stress onto the encapsulated die. External stresses can originate from interaction of the package with the circuit board to which it is soldered within an end use application. Mismatches in the Coefficient of Thermal Expansion (CTE) between the circuit board and the package can lead to stresses on the die after solder reflow and/or with subsequent temperature changes during operation. These stresses can adversely affect the performance of the integrated circuit die.

Thus, what is needed is an approach for decoupling stress sensitive electronic components of an integrated circuit die from the stresses induced by the packaging and/or by the board-mounting of the die in order to achieve improved overall performance of the die.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Figure 1:
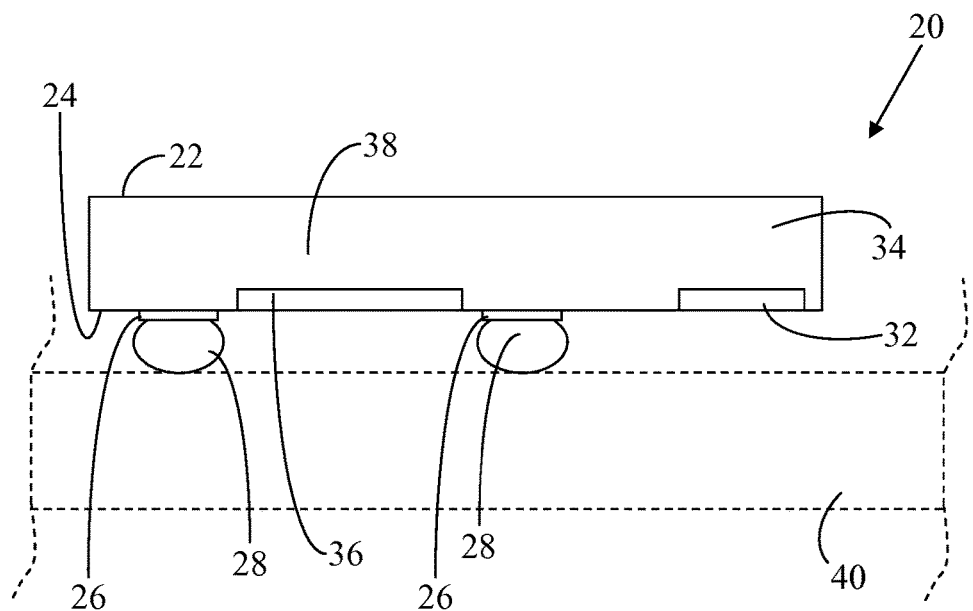
FIG. 1 shows a side view of a device package in accordance with an embodiment.

In overview, embodiments of the present invention entail a device package and methodology that significantly reduces stresses exerted on an electronic component die of the device package. In one aspect, internal stresses (for example, stresses caused by the die's interaction with the plastic molding material of the package) are reduced by employing a chip scale packaging approach in lieu of encapsulation in a plastic molded material. Electrical connection bumps, e.g., solder bumps, are applied to the active surface of the chip so that the chip can be flip-mounted to directly attach the chip to external electronic circuitry. The electrical connection bumps are suitably arranged to form a suspended "ledge" on at least one side of the chip outside of the perimeter of the electrical connection bumps. The ledge is sufficiently large to accommodate one or more devices. This suspended ledge exhibits a lower stress profile than the regions around and between the bumps. Thus, in another aspect, the external stresses (for example, stresses originating from interaction of the package with the circuit board to which it is soldered) are reduced by locating stress sensitive devices outside of the perimeter of the electrical connection bumps at these lower stress profile regions.

Electronic compasses, containing a three-axis magnetometer for sensing magnetic fields, are becoming increasingly standard equipment in devices, such as smartphones, tablets, and the like. Many of these magnetometers include one or more Hall effect magnetic field sensors integrated into the silicon of the application specific integrated circuit (ASIC). Since Hall effect sensors are made from the silicon material of the substrate, they are subject to the piezoresistive effects of the silicon crystal. The piezoresistive effect is a change in the electrical resistivity of a semiconductor or metal when mechanical strain is applied, and mechanical strain is the deformation of a solid due to stress. Thus, the piezoresistive effects of the silicon crystal can lead to zero-field offsets that are orders of magnitude larger than the target signal levels. In a particular embodiment, a magnetometer that includes one or more Hall effect magnetic field sensors is positioned outside of the perimeter of the electrical connection bumps within a lower stress profile region to achieve a low zero-field offset and therefore enhanced performance.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It is further understood that the use of relational terms, if any, such as first and second, top and bottom, and the like are used solely to distinguish one from another entity or action without necessarily requiring or implying any actual such relationship or order between such entities or actions.

Figure 2:
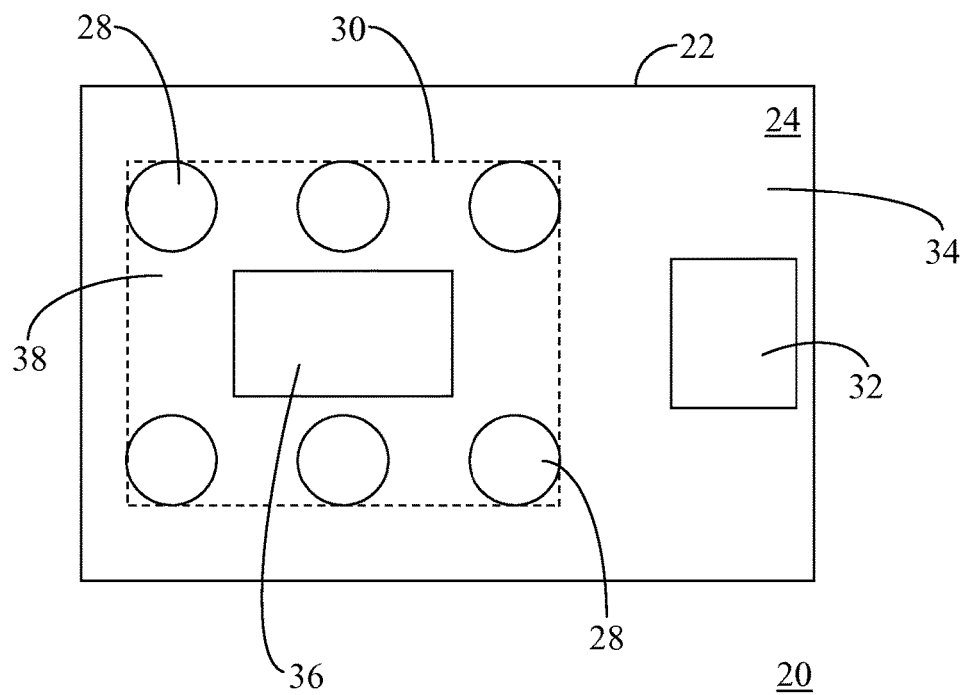
FIG. 2 shows a bottom view of the device package of FIG. 1.

Referring to FIGS. 1-2, FIG. 1 shows a side view of a device package 20 in accordance with an embodiment and FIG. 2 shows a bottom view of device package 20. Device package 20 includes a substrate 22 having an active surface 24. Contact pads 26 (visible in FIG. 1) are formed on active surface 24, and electrical connection bumps 28 are deposited on contact pads 26 of active surface 24. Electrical connection bumps 28 are arranged in an array (for example, rows and columns) having a perimeter 30. Perimeter 30 is demarcated in FIG. 2 by a dashed line encircling electrical connection bumps 28. A first electronic component 32 is formed at a first region 34 of active surface 24 and a second electronic component 36 is formed at a second region 38 of active surface 24. First region 34 is located outside of perimeter 30. Thus, electronic component 32 formed at first region 34 is laterally displaced away from perimeter 30. In contrast, second region 38 is circumscribed by perimeter 30 of electrical connection bumps 28.

In an embodiment, device package 20 is a wafer level chip scale package (WLCSP). A WLCSP typically does not call for encapsulation in a plastic molded package, thereby reducing the overall size of the package as well as eliminating or largely reducing stresses that would otherwise be imposed upon electrical components 32, 36 by the die's interaction with the plastic molding material. Further size efficiencies can be achieved by printing contact pads 26 on substrate 22 and forming electrical connection bumps 28 thereon, in lieu of utilizing a surrounding lead frame structure and wire bonds.

Contact pads 26 may be metallization structures which serve as an adhesion promoter for electrical connection bumps 28. Electrical connection bumps 28 may be tin-lead based solder bumps or other solder bumps that are deposited on active surface 24. Alternatively, electrical connection bumps 28 may be non-solder based bumps, such as nickel/gold, conductive epoxy bumps, or gold bumps that are deposited on active surface 24 via screen printing, electroplating, stud bumping, and the like.

In an end use application, device package 20 can be coupled with external circuitry 40 (a portion of which is shown in dashed line form), such as a printed circuit board, another substrate, and the like, in a flip chip position. That is, active surface 24 of device package 20 is flipped to face external circuitry 40. Electrical connection bumps 28 are thereafter coupled with connecters on external circuitry 40 via a solder reflow process, thermocompression, conductive adhesive-based attachment, and the like. In some embodiments, the space between device package 20 and external circuitry 40 may be filled with an underfill material (not shown), such as a plastic material, to provide stronger mechanical connection, provide a heat bridge, and to ensure that the solder joints are not stressed due to differential heating of device package 20 and the rest of the system. In other embodiments, an underfill material may not be introduced between device package 20 and external circuitry 40, as shown.

As particularly evident in FIG. 1, following the coupling of device package 20 to external circuitry 40 via electrical connection bumps 28, first region 34 at which first electronic component 32 is formed is suspended over external circuitry 40. In the illustrated configuration, the layout of electrical connection bumps 28 is asymmetric on active surface 24. That is, electrical connection bumps 28 are displaced toward one side of active surface 24 so that a suspended ledge is formed at which first region 34 is located and at which first electronic component 32 is positioned. This suspended ledge is subject to a lower stress profile then those regions around and between electrical connection bumps 28, e.g., second region 38 within perimeter 30 of the array of electrical connection bumps 28.

In accordance with a particular embodiment, first electronic component 32 is a stress sensitive device whose performance can be compromised by stresses, such as stress caused by the component's interaction with the plastic molding material of the package and/or stress originating from interaction of the package with the circuit board to which it is soldered within an end use application. Thus, the optimal location for the stress sensitive first electronic component 32 is at region 34 exhibiting the lowest possible stress profile relative to the regions around and between electrical connection bumps 28, e.g., second region 38 within perimeter 30 of the array of electrical connection bumps 28. The location of this lowest possible stress profile outside of perimeter 30 can vary depending upon, for example, the quantity and spacing of electrical connection bumps, the material properties, size, and thickness of substrate 22, and so forth. In some configurations, first electronic component 32 may be displaced away from perimeter 30 by a distance of at least a cross-sectional width of one of electrical connection bumps 28. For example, if electrical connection bumps 28 are round or cylindrical, first electronic component 32 is laterally displaced away from perimeter 30 by a distance of at least the diameter of electrical connection bumps 28. However, in other configurations, first electronic component 32 may be displaced away from perimeter 30 by a distance that is less than the cross-sectional width of one of electrical connection bumps 28.

As mentioned above, first electronic component 32 is a stress sensitive device whose performance can be compromised by stresses. Conversely, second electronic component 36 is not as sensitive to stress. By way of example, first electronic component 32 may be a magnetometer for sensing magnetic fields along one or more axes, and second electronic component 36 may be a CMOS (complementary metal-oxide-semiconductor) integrated circuit having active and inactive circuitry associated with first electronic component 36. In other embodiments, however, first electronic component 32 may be an accelerometer, gyroscope, pressure sensor, temperature sensor, and/or some functions of analog or digital CMOS components whose performance may be adversely affected by stress.

Figure 3:
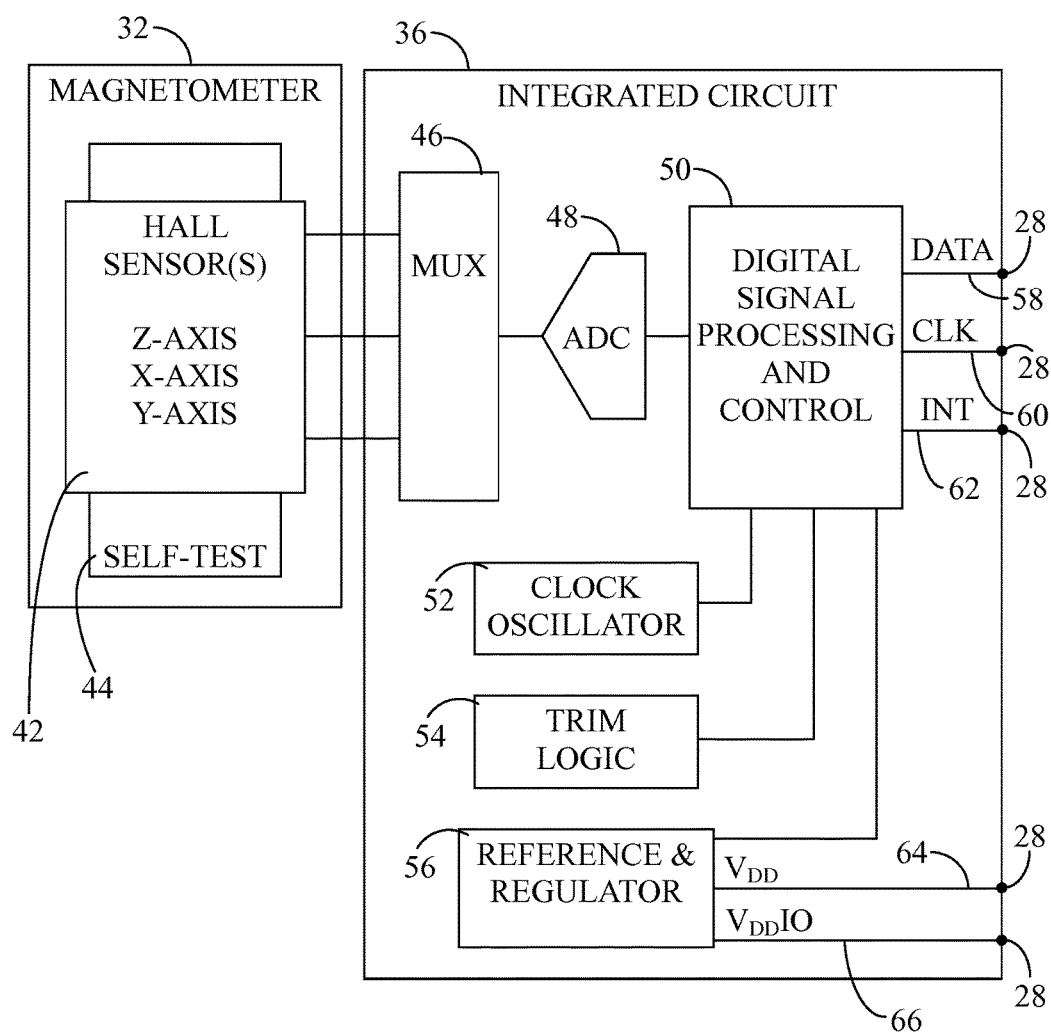
FIG. 3 shows a simplified block diagram of electronic components of the device package of FIG. 1.

FIG. 3 shows a simplified block diagram of the electronic components that may form device package 20. In one example, first electronic component 32 is a three axis magnetometer for sensing magnetic fields along the X-, Y-, and Z-axes. Magnetometer 32 may be formed using a combination of Hall effect sensors 42. Magnetometer 32 may optionally include self test circuitry 44 for testing the functionality of Hall effect sensors 42 and/or for calibration. A Hall effect sensor is a transducer that varies its output voltage in response to a magnetic field. Accordingly, Hall effect sensors 42 may be implemented in device package 20 to measure a magnetic field or changes in a magnetic field along one or more axes.

Second electronic component 36 may be an integrated circuit that performs certain functions associated with magnetometer 32. For example, output voltages from Hall effect sensors 42 may be communicated to a multiplexer 46, and subsequently to an analog-to-digital converter 48 where the output voltages are converted to digital signals. Thereafter, the digital signals corresponding to the magnetic fields along one or more axes may be communicated to a digital signal processing control block 50 which may contain circuits and function for driving Hall effect sensors and/or for evaluating measurement signals recorded by Hall effect sensors 42. Second electronic component 36 may further include a clock oscillator block 52, a trim logic block 54, and/or an analog and digital voltage reference and regulator block 56. Inputs to and outputs from second electronic component 36 can include a data signal 58, a clock signal 60, an interrupt signal 62, an analog voltage source 64 ($V_{DD}$), a digital voltage source 66 ($V_{DD}IO$), and the like. Each of the signals 58, 60, 62, and voltage sources 64, 66 may be carried into, or alternatively, out of device package 20 via electrical connection bumps 28.

The functions of second electronic component 36 are provided by way of example. Those skilled in the art will recognize that second electronic component 36 can have more or fewer functions and associated circuitry then that shown in the block diagram of FIG. 3. Alternatively, second electronic component 36 can have different functions and associated circuitry then that shown.

First and second electronic components 32, 36 are built into the silicon material of substrate 22 in accordance with known processes. Hall effect sensors 42 that make up the magnetometer of first electronic component 32 are made from the silicon material of substrate 22 and are therefore subject to the piezoresistive effects of the silicon crystal. That is, the electrical resistivity of the silicon crystal that makes up Hall effect sensors 42 can change when the silicon crystal deforms in response to stress. Thus, excessive stress can lead to zero-field offsets that are orders of magnitude larger than the target signal levels. In order to minimize the piezoresistive effect and achieve a very low offset sensor, first electronic component 32 is located outside of and is displaced away from perimeter 30 (FIG. 1) of array of electrical connection bumps 28 on the suspended ledge at first region 34 (FIG. 1). Furthermore, first electronic component 32 may be positioned within the lowest stress region of the suspended ledge at first region 34.

Conversely, the functions and circuitry of second electronic component 36 are less affected by stress. Thus, second electronic component 36 may be suitably located at high stress regions of device package, i.e. within the second region 38 (FIG. 1) circumscribed by perimeter 30.

As such, embodiments entail generating a region of low stress on substrate 22 through the optimum layout of the contact pads 26 and associated electrical connection bumps 28 to produce a suspended ledge on the outward side of perimeter 30 of electrical connection bumps 28 along at least one edge of substrate 22. This low stress region, e.g., first region 34, is sufficiently large to accommodate the stress sensitive Hall effect sensors 42. Other stress sensitive components may also be placed at this low stress region.

Figure 4:
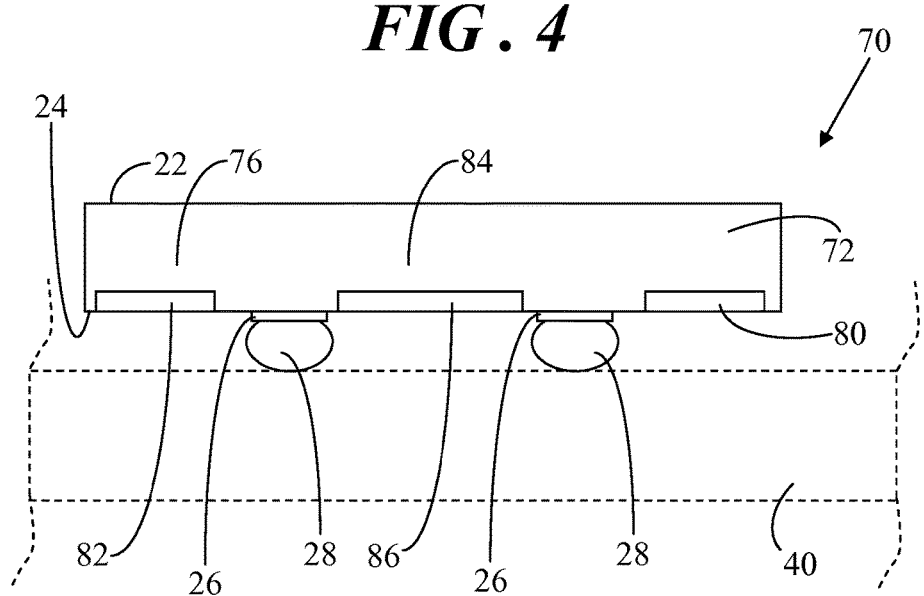
FIG. 4 shows a side view of a device package in accordance with another embodiment.
Figure 5:
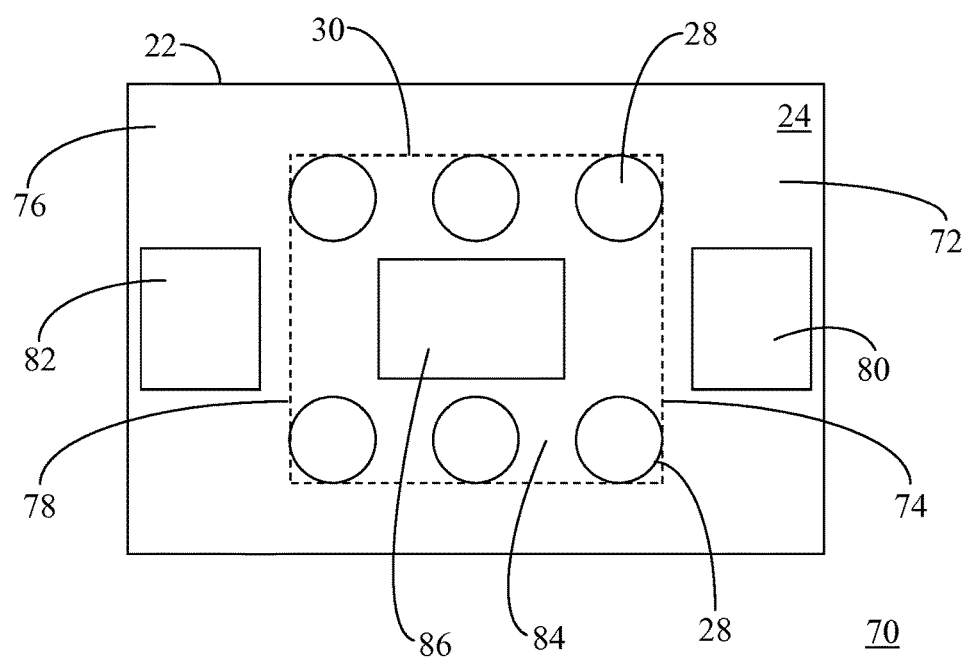
FIG. 5 shows a bottom view of the device package of FIG. 4.

Referring now to FIGS. 4-5, FIG. 4 shows a side view of a device package 70 in accordance with another embodiment and FIG. 5 shows a bottom view of the device package 70. Device package 70 includes similar components to those described in connection with device package 20 (FIG. 1). As such, the same reference numbers are used for the same components. Thus, device package 70 includes substrate 22 having active surface 24. Contact pads 26 are formed on active surface 24, and electrical connection bumps 28 are deposited on contact pads 26 of active surface 24. Perimeter 30 of electrical connection bumps 28 is demarcated in FIG. 5 by a dashed line encircling electrical connection bumps 28.

In contrast to device package 20, active surface 24 includes a first region 72 laterally displaced away from a first side 74 of perimeter 30 and a second region 76 laterally displaced away from a second side 78 of perimeter 30. First and second regions 72, 76 are located outside of perimeter 30 of the array of electrical connection bumps 28. A first stress sensitive electronic component 80 is positioned at first region 72 and a second stress sensitive electronic component 82 is positioned at second region 76. A third region 84 of active surface 24 is circumscribed by perimeter 30 of electrical connection bumps 28, and a third electronic component 86 that is less sensitive to stress than first and second stress sensitive electronic components 80, 82 may be formed at third region 84.

In an end use application, device package 70 can be coupled with external circuitry 40 (a portion of which is shown in dashed line form) in a flip chip position such that active surface 24 of device package 20 is flipped to face external circuitry 40. As particularly evident in FIG. 4, following the coupling of device package 70 to external circuitry 40 via electrical connection bumps 28, first region 72 at which first stress sensitive electronic component 80 is formed is suspended over external circuitry 40. Additionally, second region 76 at which second stress sensitive electronic component 82 is formed is suspended over external circuitry. In the illustrated configuration, the layout of electrical connection bumps 28 is generally centralized on active surface 24. That is, they are displaced toward one side of active surface 24 so that two suspended ledges, i.e., first region 72 and second region 76, are produced. Both of these suspended ledges are subject to a lower stress profile then those regions around and between electrical connection bumps 28, e.g., third region 84 within perimeter 30 of the array of electrical connection bumps 28.

First and second stress sensitive electronic components 80, 82 are those components of device package 70 whose performance can be compromised by various stresses, as discussed above. Whereas, third electronic component 86 is not as sensitive to stress. By way of example, components 80, 82 may include a magnetometer, accelerometer, gyroscope, pressure sensor, temperature sensor, and/or some functions of analog or digital CMOS components that are sensitive to stress. Third electronic component 86 may be a CMOS integrated circuit having active and inactive circuitry associated with first and second stress sensitive electronic components 80, 82. Thus, device package 70 includes sufficiently large low stress regions for multiple stress sensitive electronic components.

Figure 6:
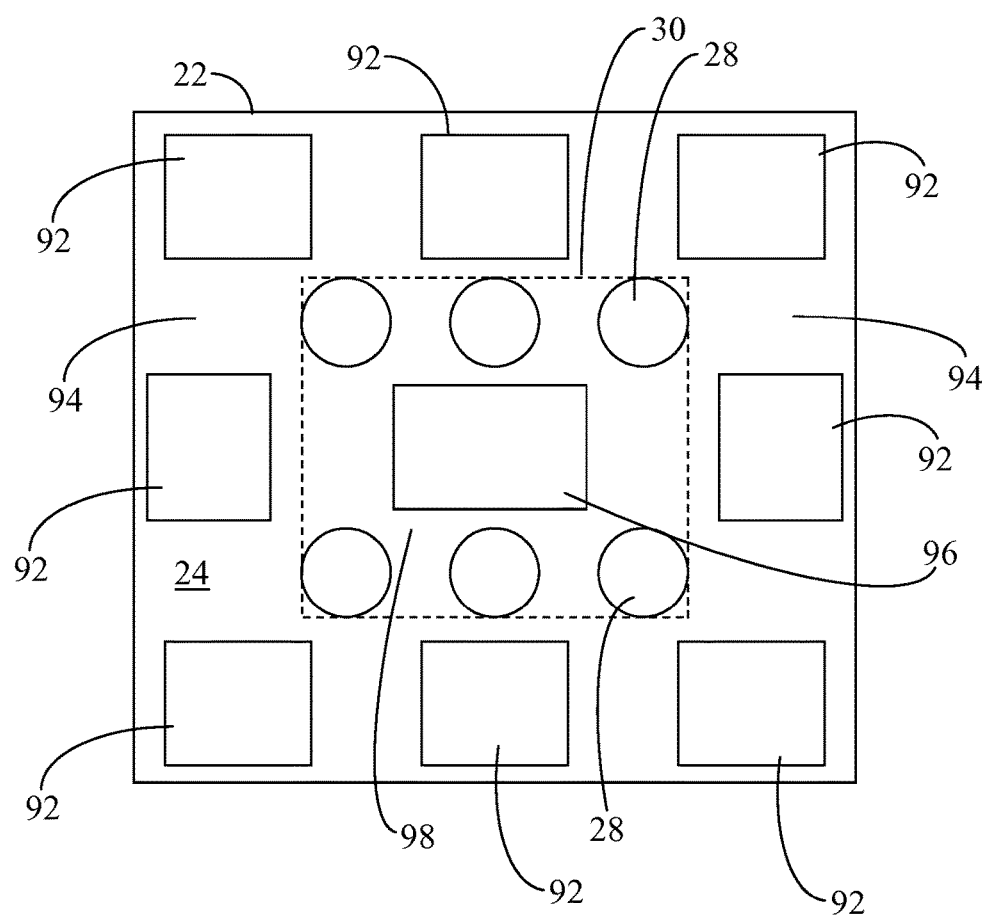
FIG. 6 shows a bottom view of a device package in accordance with another embodiment.

FIG. 6 shows a bottom view of a device package 90 in accordance with another embodiment. Device package 90 is another variation of a package that includes lower stress suspended ledges at which stress sensitive electronic components 92 may be positioned. In this example, device package 90 includes substrate 22 and electrical connection bumps 28 whose perimeter 30 is approximately centered on active surface 24. Accordingly, a low stress region 94 of device package 90 entails an entire circumference of active surface 24 outside of perimeter 30. Thus, device package 90 provides sufficiently large low stress region 94 at which a multiplicity of stress sensitive electronic components 92 may be positioned. Additionally, an electronic component 96 that is less sensitive to stress may be located at active surface 24 within a higher stress region 98 circumscribed by perimeter 30.

Figure 7:
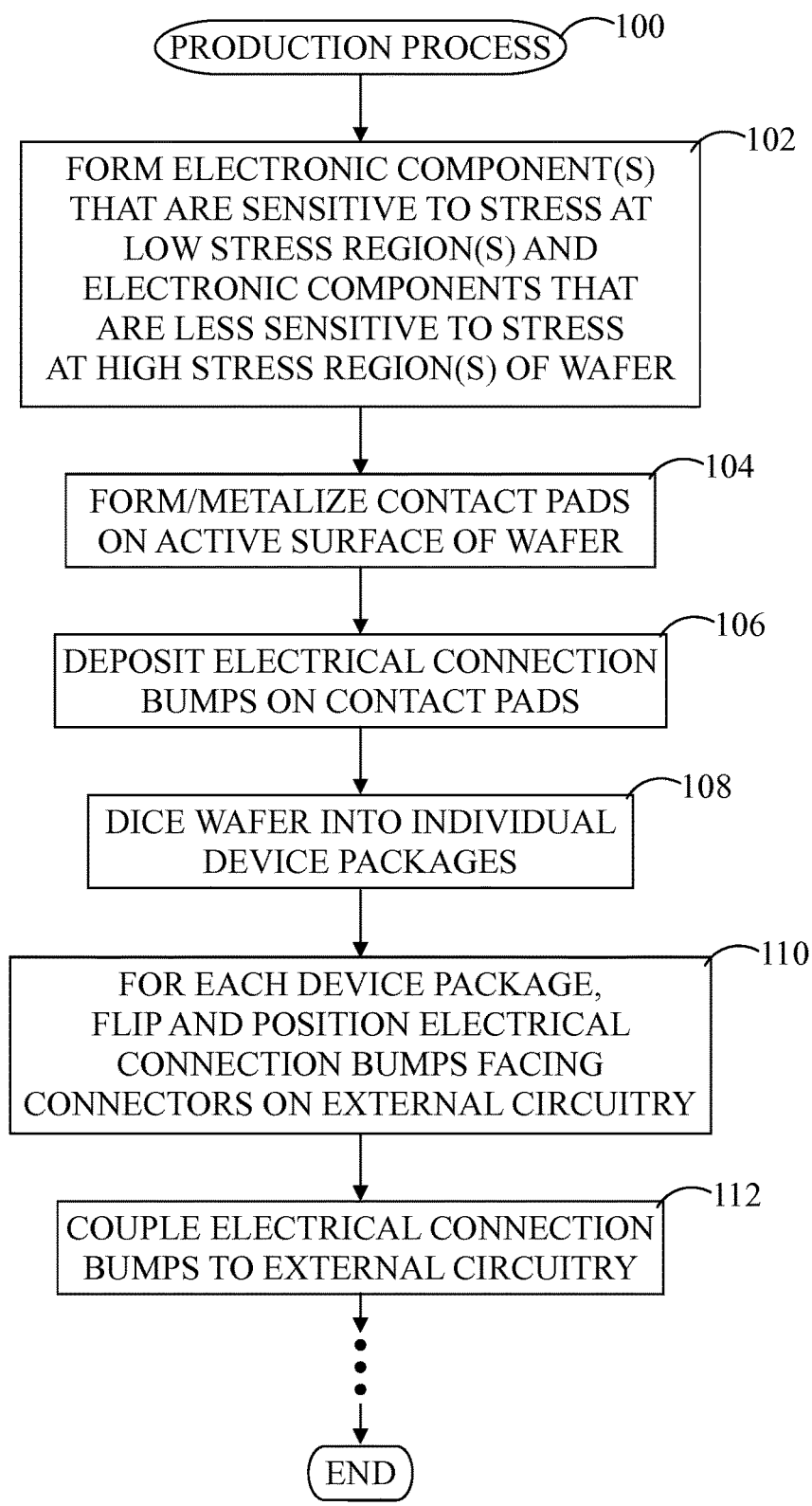
FIG. 7 shows a flowchart of a production process for producing any of the device packages of FIGS. 1-6.

FIG. 7 shows a flowchart of a production process 100 for producing any of device packages 20, 70, 90 of FIGS. 1-6. That is, device packages 20, 70, 90 are configured having low stress regions at which stress sensitive components may be located. For purposes of illustration, the fabrication of device package 20 is discussed in connection with production process 100. Thus, reference should be made to FIGS. 1 and 2 in connection with production process 100.

At a block 102 of production process 100, electronic component(s) that are sensitive to stress are formed at low stress regions of a wafer and electronic component(s) that are less sensitive to stress are formed at higher stress regions of the same wafer. Multiple device packages 20 may be produced using wafer level fabrication technologies. For example, active surface 24 of a substrate wafer 22 is populated with a multiplicity of first electronic components 32 at a corresponding multiplicity of first regions 34, and concurrently, active surface 24 of substrate wafer 22 is populated with a multiplicity of second electronic components 36 at a corresponding multiplicity of second regions 38.

At a block 104, contact pads 26 are formed on active surface 24 of the substrate wafer 22. Contact pads 26 may be formed as a structured metallization layer onto active surface 24, and may be formed from aluminum, copper, gold, or an electrically conductive alloy. A rewiring or redistribution layer (not shown) may optionally be formed between active surface 24 and contact pads 26. The rewiring or redistribution layer serves to connect contact pads 26 integrated into active surface 24 to the eventually deposited electrical connection bumps 28, if electrical connection bumps 28 are not situated directly in contact with contact pads 26. Thus, electrical connection bumps 28 can be optimally arranged at particular locations on active surface 24 to form the array of electrical connection bumps demarcated by perimeter 30.

At a block 106, electrical connection bumps 28 may be deposited on contact pads 26 of active surface 24. Electrical connection bumps 28 are provided for making an electrical connection between device package 20 and the electronic circuitry to which it will eventually be connected, e.g., a printed circuit board. Solder deposits, for example in the form of solder balls, may be applied to contact pads 26. The solder balls (electrical connection bumps 28) can be applied by means of "ball placement" in which preformed balls made of solder material are applied to contact pads 26. The adhesion between the solder balls and contact pads 26 is brought about by a flux that has been printed on beforehand by, for example, stencil printing. Application of the solder balls may be followed by a thermal process (reflow) in which the solder material melts and wets contact pads 26. Although one exemplary technique is described herein, those skilled in the art will recognize that electrical connection bumps 28 may be deposited on contact pads 26 via alternative techniques.

At a block 108, the substrate wafer 22 is diced, sawn, or otherwise separated into a plurality of individual device packages 20, or chips. After separation at block 108, each individual device package 20 can be flipped and its electrical connection bumps 28 can be positioned facing connectors (not shown) on external circuitry 40 at a block 110. At a block 112, electrical connection bumps 28 are coupled to external circuitry 40 by forming solder connections, a thermocompression process, application of a conductive adhesive, or another known technique. Thereafter, further processing may optionally entail underfilling the space between device package 20 and external circuitry and/or further processing may entail other operations not shown herein for brevity. Following processing, production process 100 ends.

It is to be understood that certain ones of the process blocks depicted in FIG. 7 may be performed in parallel with each other or with performing other processes. In addition, it is to be understood that the particular ordering of the process blocks depicted in FIG. 7 may be modified, while achieving substantially the same result. Accordingly, such modifications are intended to be included within the scope of the inventive subject matter.

Thus, various device packages and a method for producing the device packages have been described. An embodiment of a device package comprises a substrate having an active surface. Electrical connection bumps are deposited on the active surface, the electrical connection bumps being arranged in an array having a perimeter. An electronic component is formed at a region of the active surface, the region being located outside of the perimeter of the array of the electrical connection bumps.

An embodiment of a method for producing a device package comprises forming a stress sensitive electronic component at a first region of an active surface of a substrate and depositing electrical connection bumps on the active surface of the substrate, the electrical connection bumps being laterally displaced away from the first region, the electrical connection bumps being arranged in an array having a perimeter, and the first region being located outside of the perimeter.

The device packages and methodology, discussed above, and the inventive principles thereof are intended to and can reduce stresses exerted on an electronic component of the device package that can otherwise adversely affect device performance. Stresses (for example, stresses caused by the die's interaction with the plastic molding material of the package) are reduced by employing a wafer level chip scale packaging approach in lieu of encapsulation in a plastic molded material. Electrical connection bumps are applied to the active surface of the chip so that the chip can be flip-mounted to directly attach the chip to external electronic circuitry. The electrical connection bumps are suitably arranged to form a suspended "ledge" on at least one side of the chip outside of the perimeter of the electrical connection bumps. The ledge is sufficiently large to accommodate one or more devices. This suspended ledge exhibits a lower stress profile than the regions around and between the bumps. Thus, stress sensitive devices are located outside of the perimeter of the electrical connection bumps at these lower stress profile regions so that stresses (for example, stresses originating from interaction of the package with the circuit board to which it is soldered) exerted on the stress sensitive devices are reduced.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device package comprising:
   a substrate having an active surface;
   electrical connection bumps deposited on said active surface, said electrical connection bumps being configured to be interposed between said substrate and external circuitry for connecting said substrate to said external circuitry without utilizing a lead frame, said electrical connection bumps being arranged in an array having a perimeter, said perimeter defining an outer boundary of an area on said active surface at which said array of electrical connection bumps are located; and
   an electronic component formed at a region of said active surface, said region being located outside of said perimeter of said array of said electrical connection bumps, wherein said electronic component is configured to be interposed between said substrate and said external circuitry.

2. The device package of claim 1 wherein following coupling of said electrical connection bumps with said external circuitry, said region at which said electronic component is formed is suspended over said external circuitry.

3. The device package of claim 1 wherein said electronic component is displaced laterally away from said perimeter of said electrical connection bumps.

4. The device package of claim 1 wherein said region of said active surface located outside of said perimeter of said array is subject to a lower stress profile than a second region of said active surface circumscribed by said perimeter of said array.

5. The device package of claim 4 wherein said electronic component comprises at least one Hall effect sensor.

6. The device package of claim 4 wherein said region is a first region, said first region is laterally displaced away from a first side of said perimeter of said array, and said active surface of said substrate includes a second region outside of said perimeter of said array, said second region being laterally displaced away from a second side of said perimeter of said array.

7. The device package of claim 6 wherein said electronic component is a first stress sensitive electronic component, and said device package further comprises a second stress sensitive electronic component positioned at said second region.

8. The device package of claim 1 wherein said electronic component comprises a magnetometer.

9. The device package of claim 8 wherein said magnetometer comprises at least one Hall effect sensor.

10. The device package of claim 1 wherein said electronic component is a first electronic component, and said device package further comprises a second electronic component formed at a second region of said active surface, said second region being circumscribed by said perimeter of said electrical connection bumps, said second electronic component being less sensitive to stress than said first electronic component.

11. The device package of claim 10 wherein said second electronic component comprises an integrated circuit associated with said first electronic component.

12. A device package comprising:

a substrate having an active surface;

electrical connection bumps deposited on said active surface, said electrical connection bumps being configured to be interposed between said substrate and external circuitry for connecting said substrate to said external circuitry without utilizing a lead frame, said electrical connection bumps being arranged in an array having a perimeter, said perimeter defining an outer boundary of an area on said active surface at which said array of electrical connection bumps are located;

a first electronic component positioned at a first region of said active surface of said substrate, said first region being located outside of said perimeter of said electrical connection bumps; and a second electronic component located at a second region of said active surface of said substrate, said second region being circumscribed by said perimeter of said electrical connection bumps, said second electronic component being less sensitive to stress than said first electronic component, wherein said first region is subject to a lower stress profile than a second region of said active surface circumscribed by said perimeter of said array, and wherein said first and second electronic components are configured to be interposed between said substrate and said external circuitry.

13. The device package of claim 12 wherein said first region of said active surface located outside of said perimeter of said electrical connection bumps is suspended over said external circuitry following coupling of said electrical connection bumps with said external circuitry.

14. The device package of claim 12 wherein said first electronic component comprises a magnetometer having at least one Hall effect sensor.

15. The device package of claim 14 wherein said second electronic component comprises an integrated circuit associated with said magnetometer.

* * * * *